(12) United States Patent
Lee

(10) Patent No.: US 6,235,385 B1
(45) Date of Patent: May 22, 2001

(54) ELECTRICALLY CONDUCTIVE ADHESIVE TAPE

(75) Inventor: Yong-In Lee, Seoul (KR)

(73) Assignee: Shin Wha Products Co., Ltd., Kyunggi-Do (KR)

(*) Notice: Subject to any disclaimer, the term of this patent is extended or adjusted under 35 U.S.C. 154(b) by 0 days.

(21) Appl. No.: 09/253,927

(22) Filed: Feb. 22, 1999

(30) Foreign Application Priority Data

| May 6, 1998 | (KR) | ................................................. 98-16100 |
| May 19, 1998 | (KR) | ................................................. 98-17956 |

(51) Int. Cl.$^7$ ................................. C09J 7/02; B32B 7/12
(52) U.S. Cl. .......................... 428/344; 428/343; 428/354; 428/458; 428/461; 428/480
(58) Field of Search ..................... 428/344, 343, 428/354, 143, 148, 458, 461, 480

(56) References Cited

U.S. PATENT DOCUMENTS

| 2,808,352 | * | 10/1957 | Coleman et al. | ................. | 428/344 X |
| 3,475,213 | * | 10/1969 | Stow | ................................. | 428/344 X |
| 3,762,946 | * | 10/1973 | Stow et al. | ........................... | 117/227 |
| 3,778,306 | * | 12/1973 | Stow | ................................. | 428/344 X |
| 4,960,490 | * | 10/1990 | Berg et al. | ............................. | 156/656 |
| 5,246,771 | * | 9/1993 | Kawaguchi | ........................... | 428/261 |
| 5,939,190 | * | 8/1999 | Pfaff et al. | ............................. | 428/344 |

* cited by examiner

Primary Examiner—Daniel Zirker
(74) Attorney, Agent, or Firm—Harrison & Egbert

(57) ABSTRACT

An electrically conductive adhesive tape used for electrical and electronic products to bond or fix an element to a support while maintaining an electrical conductibility between the element and support. The conductive adhesive tape has a structure including a resin film, a metal layer formed over one surface of the resin film by depositing a conductive metal over the surface of the resin film, and a conductive adhesive layer coated over the metal layer. The metal layer has a net-shaped structure. In some cases, the metal layer may have a planar structure. The conductive adhesive tape has a very small thickness by virtue of its metal layer deposited to a very small thickness. Accordingly, the conductive adhesive tape maintains a desired strength while exhibiting a high flexibility and a high bondability, thereby exhibiting a superior conductibility. In the case in which the metal layer has a net-shaped structure, the tape has a structure having spaces where the metal layer does not exist. Where the tape is applied to a Braun tube, accordingly, there is no influence on an electron beam emitted from a deflection yoke while a desired conductibility is maintained. The manufacture of the tape is simple. By virtue of the conductibility, the tape of the present invention also has an elecromagnetic wave shielding function.

3 Claims, 2 Drawing Sheets

ELECTRICALLY CONDUCTIVE ADHESIVE TAPE

BACKGROUND OF THE INVENTION

1. Field of the Invention

The present invention relates to an electrically conductive adhesive tape formed by depositing a conductive metal layer over one surface of a resin film.

2. Description of the Prior Art

Electrically conductive adhesive tapes are widely used in a variety of technical fields associated with electrical and electronic products to bond or fix an element to a support while maintaining an electrical conductibility between the element and support.

For example, such conductive adhesive tapes are widely used in assembling processes for video display appliances such as televisions. Where such conductive adhesive tapes are used in an assembling process for a television, they serve to fix the Braun tube of the television while grounding electrostatic charges and electromagnetic waves accumulatively induced on the outer peripheral surface of the Braun tube, thereby removing the electrostatic charges and electromagnetic waves. Such conductive adhesive tapes are also widely used in assembling processes for cars and electronic products.

Generally, a Braun tube is comprised of an evacuated bulb made of glass, so that it is likely to be damaged in the event of an external impact. For this reason, such a Braun tube is not directly fixed to a casing or housing, but fixed to the casing or housing by means of a bracket bonded to the outer peripheral surface of the Braun tube by means of an adhesive tape.

Since the adhesive tape used to bond the bracket to the Braun tube has a buffering function, it is possible to prevent the Braun tube from being damaged. Even though the Braun tube explodes as it is broken in the event of a severe external impact or other accident, it is possible to reduce the flying range of pieces of broken glass, by virtue of the adhesive tape.

For such an adhesive tape adapted to fix a bracket to a Braun tube, an electrically conductive tape is mainly used in order to additionally prevent electrostatic charges and electromagnetic waves induced on the outer peripheral surface of the Braun tube from being outwardly emitted.

In a Braun tube used in video display appliances such as televisions, a very high voltage is applied to the inner surface of the Braun tube so as to form an image on that inner surface. Due to the application of such a very high voltage, electrostatic charges are induced on the outer peripheral surface of the Braun tube. When such electrostatic charge is accumulated as no removal thereof is carried out, a magnetic field and an electric field are generated. As a result, electromagnetic waves are outwardly emitted.

Recent expansion of the application of such a Braun tube results in an increase in the possibility that the user may touch or otherwise come into contact with the Braun tube. However, electromagnetic waves emitted from the Braun tube are harmful to people. Electrostatic charges induced on the Braun tube adversely influence the functions of the Braun tube. When the user is in contact with electrostatic charges for an extended period of time, he may experience unpleasant effects. In severe cases, such electrostatic charges may cause various diseases. A disturbance phenomenon may occur in electronic circuits included in the television, due to the electrostatic charges induced on the Braun tube. In severe cases, an image jittering phenomenon may occur.

In order to prevent an accumulation of electrostatic charges induced on the Braun tube and to shield electromagnetic waves emitted from the Braun tube, a variety of methods have been proposed. One method is to use an electrically conductive adhesive tape, as shown in FIG. 1.

In accordance with the method shown in FIG. 1, an elongated, electrically conductive adhesive tape is cut into pieces having a desired length. The conductive adhesive tape pieces are bonded to the outer peripheral surface of a Braun tube while being uniformly spaced from one another. An iron bracket 4 is then bonded to the outer peripheral surface of the Braun tube by means of the conductive adhesive tape pieces while being electrically connected to the conductive adhesive tape pieces. Thus, electrostatic charges induced on the Braun tube is discharged via the bracket to an earth circuit 3 equipped in a cabinet.

Referring to FIGS. 2 and 4, an electrically conductive adhesive tapes are illustrated which is typically used for the above mentioned purpose. As shown in FIGS. 2 and 4, the conductive adhesive tape includes a conductive metal foil 11 made of copper or aluminum, a conductive adhesive layer 10 formed over the conductive metal foil 11, and a strippable protective sheet. The conductive adhesive tape is used after stripping the protective sheet therefrom.

As shown in FIG. 1, the Braun tube has several sections, namely, a display panel section having a conductive surface on its inner surface to display an image, a neck section accommodating an electron gun 9, and a funnel section jointing the panel section to the neck section. In order to provide the conductive surface, a conductive layer 2 is formed on the inner surface of the display panel section by sputtering metal or conductive ceramic. A deflection yoke, which serves to stabilize an electron beam emitted from the electron gun 9, is mounted in the funnel section. A funnel-shaped metal sheet 8 is also mounted around the funnel section in order to shield electromagnetic waves emitted from the funnel section. A desired portion of the remaining outer surface of the Braun tube is attached with a conductive adhesive tape 7 in order to prevent an accumulation of electrostatic charges induced on the Braun tube and an emission of electromagnetic waves from the Braun tube.

In FIG. 1, the reference numeral 5 denotes a silicon resin layer adapted to insulate the outer surface of the Braun tube from a high-voltage current flowing from an anode. The reference numeral 6 denotes the anode.

The deflection yoke, which is not shown in FIG. 1, is comprised of an electromagnet and adapted to amplify an electron beam emitted from the electron gun 9 while adjusting the advance direction of the electron beam. Where a conductive adhesive tape, which has the structure shown in FIG. 2 while having a nonferrous metal layer covering the entire upper or lower surface thereof, lines of magnetic force emitted from the deflection yoke can not pass through the nonferrous metal layer. Such lines of magnetic force serve to uniformly spread the electron beam emitted from the electron gun. The nonferrous metal layer shields lines of magnetic force having such a function, thereby resulting in a degradation in picture quality.

The present invention relates to an electrically conductive adhesive tape including a deposited metal layer having a net-shaped structure, as shown in FIG. 3c, thereby being capable of preventing an accumulation of electromagnetic charge and an emission of electromagnetic waves without interfering with the effect provided by lines of magnetic force. In FIGS. 3a to 3c, the metal layer is denoted by the reference numeral 13.

The metal layer 13 may have a structure completely covering the entire upper surface of a resin film, in association with Braun tube sections not being subjected to the influence of lines of magnetic force, namely, having no effect provided by the metal layer.

Conventional conductive tapes are made using a method in which a conductive metal foil, such as an aluminum foil or copper foil, is bonded to a conductive adhesive layer formed by coating a conductive adhesive over a surface of a strippable protective sheet, or a method in which a conductive metal foil coated at one surface thereof with a conductive adhesive layer and subjected to a release process at the other surface thereof is used so that it can be rolled without using any strippable protective sheet.

Here, the term "conductive adhesive" means an adhesive having an adhesive material produced by dissolving an acrylic resin or rubber in an organic solvent, and a certain amount of conductive metal powder added in the adhesive material, and exhibiting a conductibility determined in accordance with the added amount of the conductive metal powder.

The conductive metal powder may include copper, aluminum, nickel, chromium, or graphite. The amount of the conductive metal powder added to the adhesive material may be about 50 to 200 parts by weight based on 100 parts by weight of the adhesive material under the condition in which the conductive metal powder has a grain size of 100 mesh or less.

In accordance with the amount of added conductive metal powder, it is possible to adjust the thickness of the adhesive layer and the electrical resistance of the adhesive tape.

In conventional conductive adhesive tapes, which have a metal foil layer and a conductive adhesive layer, a metal foil is used which has an unnecessarily large thickness and exhibits a low flexibility and a low stretchability. For this reason, conventional conductive adhesive tapes are likely to be crumpled and torn. When such a conductive adhesive tape is cut into tape pieces upon using it, it is difficult to tear the tape in a direction perpendicular to the longitudinal direction of the tape using a manual force. Furthermore, the surface color of the metal foil, namely, the color of aluminum or copper, which may not match with the peripheral color, appears at the surface of the tape as it is. Since the tape exhibits a low flexibility, a degraded bondability is exhibited when the tape is bonded to tube sections having curved portions. In this case, a degradation in fixability and conductibility occurs.

Moreover, it is difficult for such a metal foil to have a structure bearing spaces, for example, a net-shaped structure. For this reason, such a metal foil shields lines of magnetic force serving to uniformly spread an electron beam emitted from an electron gun, thereby resulting in a degradation in picture quality. Consequently, conductive adhesive tapes having such a metal foil can not be used for tube sections associated with lines of magnetic force.

In the case of a copper foil, it is oxidized at its surface into a copper oxide exhibiting bluish green or dark brown color. Since such a copper oxide is non-conductive, there is a problem in that the conductibility of the conductive adhesive tape is degraded.

Since the above mentioned conventional metal foil has a relatively large thickness of about 25 to 70 $\mu$m, a tape using such a metal foil has a relatively large thickness of 100 $\mu$m or more. As a result, the tape is likely to be crumpled. Due to such a tendency, it is difficult to obtain a satisfactory surface bonding of the tape. Furthermore, the tape exhibits a degraded flexibility due to the large thickness of the metal foil. In order to obtain a uniform surface bonding of the tape to a curved surface, it is necessary to apply a certain amount of manual pressure to the tape upon bonding the tape to the curved surface. Otherwise, a separate tool should be used. For this reason, there is inconvenience. The tape may also be likely to exhibit a degraded appearance due to its easy crumpling property. Such a conductive adhesive tape requires no or low tensile strength while requiring a desired conductibility. However, such a conductive adhesive tape unnecessarily has a high tensile strength due to its relatively large thickness resulting from a large thickness of the metal foil. This only results in an increase in the manufacturing cast.

SUMMARY OF THE INVENTION

An object of the invention is to provide an electrically conductive adhesive tape which has a structure including a resin film, a net-shaped metal layer deposited over one surface of the resin film, and a conductive adhesive layer coated over the metal layer, thereby being capable of having no influence on lines of magnetic force generated from a deflection yoke included in a Braun tube, to which the tape is applied, while preventing an accumulation of electrostatic charges induced on the Braun tube and an emission of electromagnetic waves.

In order to accomplish these objects, the present invention provides an electrically conductive adhesive tape comprising: a resin film; a metal layer formed over one surface of said resin film by depositing a conductive metal over the surface of the resin film; and a conductive adhesive layer coated over the metal layer.

In accordance with an embodiment of the present invention, the metal layer has a net-shaped structure.

Since the conductive adhesive tape of the present invention has a very small thickness while maintaining a desired strength and exhibiting a high flexibility, it can easily maintain its bonding to a curved surface. The conductive adhesive tape can also maintain a high conductibility. This conductive adhesive tape exhibits a high productivity and a great reduction in the manufacturing costs, and contributes to a lightness of electronic products to which it is applied.

BRIEF DESCRIPTION OF THE DRAWINGS

Other objects and aspects of the invention will become apparent from the following description of embodiments with reference to the accompanying drawings in which:

FIGS. 3*a* to 3*c* illustrate a conductive adhesive tape including a deposited metal layer having a net-shaped structure in accordance with an embodiment of the present invention, respectively, wherein FIG. 3*a* is a cross-sectional view of a tape substrate in a state not coated with a conductive adhesive, FIG. 3*b* is a cross-sectional view of the conductive adhesive tape coated at its tape substrate with the conductive adhesive, and FIG. 3*c* is a plan view of the conductive adhesive layer having a net-shaped structure.

DESCRIPTION OF THE PREFERRED EMBODIMENTS

Figure 3A:
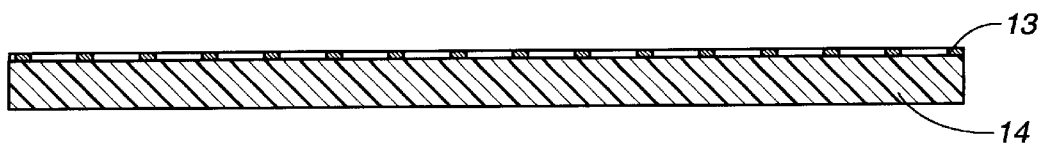
Figure 3B:
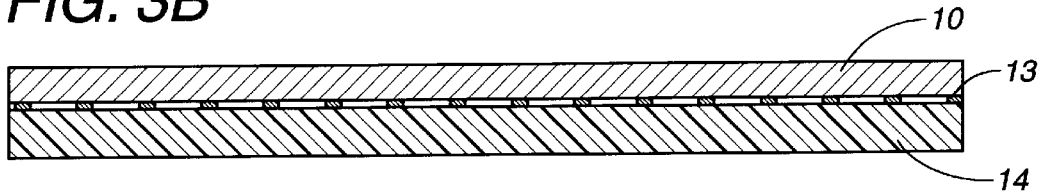

Referring to FIGS. 3*a* and 3*b,* the procedure for forming an electrically conductive adhesive tape according to the present invention is illustrated.

As shown in FIG. 3b, the conductive adhesive tape of the present invention has a resin film 14, a net-shaped metal layer 13 deposited over the upper surface of the resin film 14, and a conductive adhesive layer 10 coated over the metal layer 13. The resin film 14 may be a plastic film made of polyethylene (PE), polyethylene terephthalate (PET), polypropylene, or nylon. The metal layer 13 is formed over the resin film 14 to have a net structure. The formation of the metal layer 13 is carried out by depositing a conductive metal, such as aluminum, over one surface of the resin film 14, namely, the upper surface of the resin film 14, using a vacuum evaporating coating or sputtering method, in such a fashion that the deposited metal layer has a net-shaped structure having a very small thickness specified in terms of angstroms (Å: $10^{-8}$ cm; 0.1 μm). The metal of the metal layer 13 may include aluminum, copper, silver, brass, nickel, or chromium.

Preferably, the metal layer has a thickness of about 10Å. The thickness of the resin film 14 is preferably ranged from 10 μm to 25 μm, and the thickness of the conductive adhesive layer is preferably ranged from 25 μm to 45 μm. Thus, the overall thickness of the tape is ranged from 40 μm to 60 μm. This thickness range of the tape corresponds to half the thickness range of conventional tapes. By virtue of such a reduced thickness, the tape of the present invention exhibits a high flexibility while being degraded in conductibility. Accordingly, it is possible to achieve an improvement in bondability.

The conductive adhesive tape of the present invention also exhibits a low crumpling tendency as compared to conventional conductive adhesive tapes including a well-known metal foil. It is also possible to allow the tape to have an optional color in accordance with the selection of an appropriate metal to be deposited. Since the conductive adhesive layer 10 is coated over the metal layer 13, no oxidation occurs at the surface of the metal layer 13 with the lapse of time. Accordingly, there is no reduction in permittivity.

The present invention will now be described in detail with reference to the following example, but the present invention is not to be construed as being limited thereto.

EXAMPLE

| | |
|---|---|
| * acrylic adhesive (containing a solid portion in a content of 40%) | 100 parts by weight |
| * copper powder having a mean grain size of 100 mesh | 50 parts by weight |

The above materials were prepared and then uniformly mixed together. Using the resulting mixture, an acryl-based conductive adhesive was produced.

The above conductive adhesive is a well-known acrylic resin or rubber-based adhesive containing conductive metal powder which is used in this technical field.

Figure 3C:
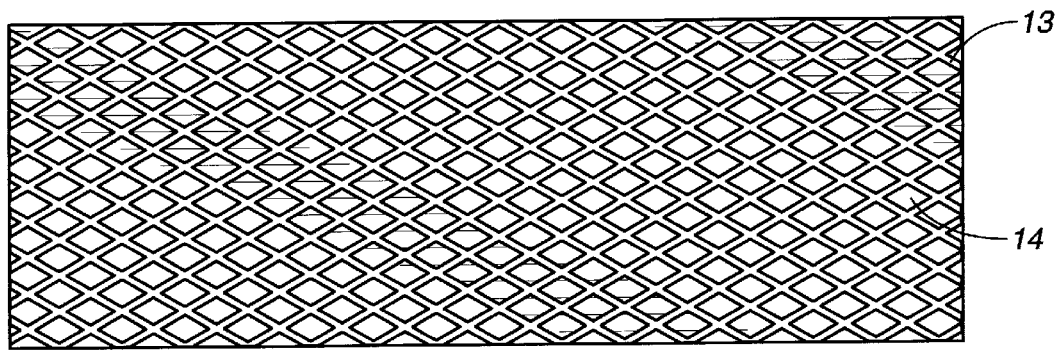
Figure 4:
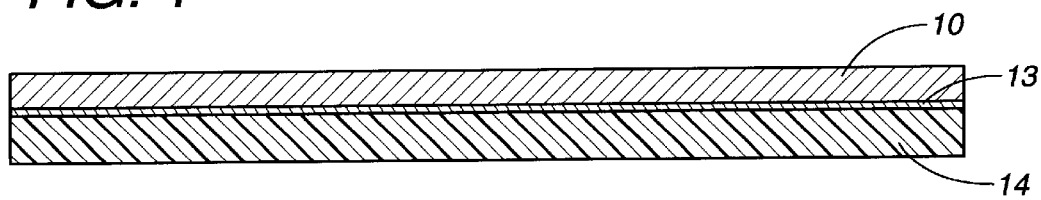
FIG. 4 is a cross-sectional view illustrating a conductive adhesive tape including a resin film and a metal layer deposited over the entire upper surface of the resin film.

A PET film having a thickness of 15 μm was separately prepared. An adhesive was then coated over one surface of the PET film using a gravure printing method, thereby forming an adhesive layer having a net-shaped structure over the PET film, as shown in FIG. 3. The adhesive layer preferably had a mesh size of 80 to 100 mesh. The resulting PET film coated with the adhesive was then passed through a vacuum furnace at a uniform speed under the condition in which aluminum was evaporated in the vacuum furnace. As a result, aluminum was vacuum-deposited only on the upper surface of the net structure defined by the adhesive layer. The deposition of aluminum was carried out to form an aluminum layer having a thickness of about 10 Å. The method for depositing metal such as aluminum over a synthetic resin film is well known in this technical field.

Thereafter, the conductive adhesive was coated to a thickness of about 30 μm over the net-shaped aluminum layer of the PET film and then dried. Thus, a conductive adhesive tape was obtained. The conductive adhesive tape had a thickness of about 45 μm.

Figure 1:
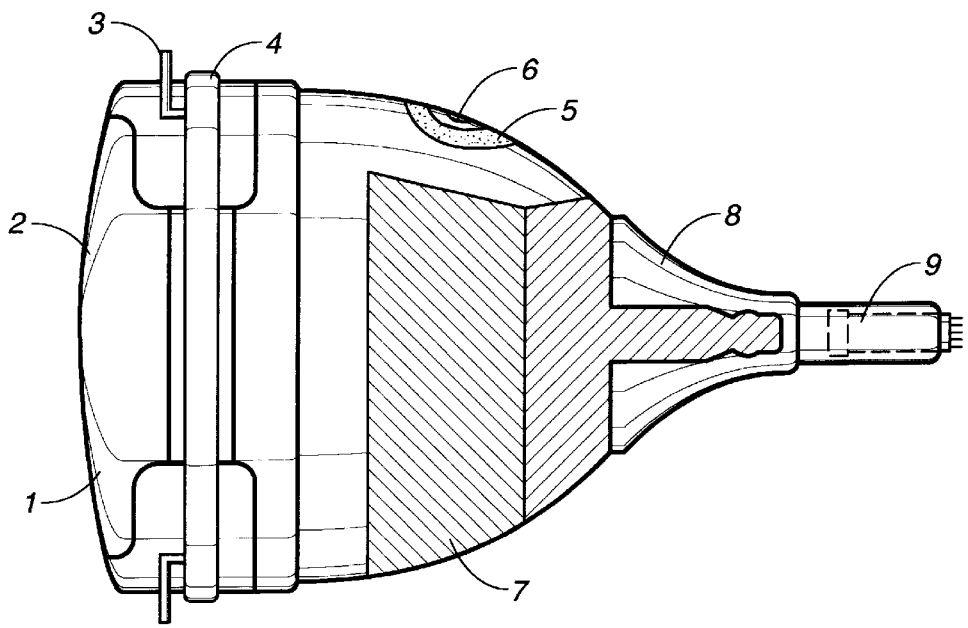
FIG. 1 is a side view illustrating an electromagnetic wave shielding structure conventionally applied to a Braun tube.
Figure 2:
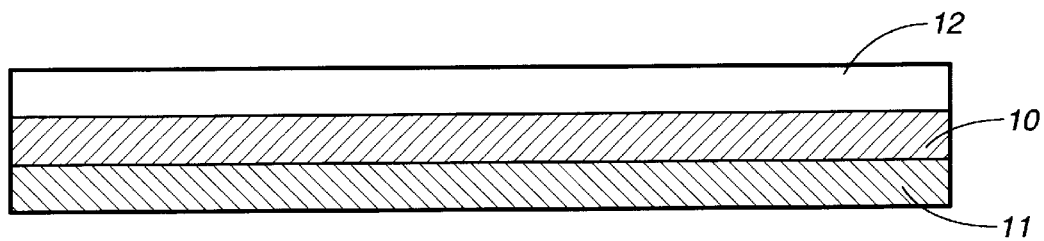
FIG. 2 is a cross-sectional view illustrating a conventional conductive adhesive tape.

Although the conductive adhesive tape of the present invention has a structure including a metal layer deposited to a very small thickness specified in terms of angstroms using a vacuum deposition process, it maintains a desired strength while exhibiting a high flexibility (bending ability) because the metal layer is formed integrally with a substrate (a plastic film) over which the metal layer is deposited. Since the metal layer is coated at the exposed surface thereof with a conductive adhesive, it does not exhibit any discoloration. In accordance with the present invention, it is also possible to achieve a high productivity while producing uniform products. A great reduction in the manufacturing costs is also achieved. In particular, the tape has a bonding surface exhibiting a uniform planarization. Accordingly, the deposited aluminum layer of the tape can have a very small thickness as compared to that in the conventional tape shown in FIG. 1. This results in a great reduction in the manufacturing costs. Where the tape of the present invention is used for a Braun tube, it provides an effect of shielding electrostatic charges and electromagnetic waves without influencing lines of magnetic force because it has a structure having spaces where the metal layer does not exist. Where the tape having the above mentioned structure is practically applied to portions of an electrical or electronic product requiring removal of electrostatic charges, shielding, absorption, reduction, and dissipation of electromagnetic waves, it not only exhibits a softness as in general plastic film products, but also exhibits a smoothness at its bonding surface.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An electrically conductive adhesive tape comprising:
    a resin film;
    a metal layer formed over one surface of said resin film by depositing a conductive, metal about 10 Angstroms thick in a net form onto said one surface of said resin film; and
    a conductive adhesive layer coated over said metal layer.

2. The electrically conductive adhesive tape in accordance with claim 1, wherein said resin film is a synthetic resin film made of a material selected from the group consisting of polyethylene, polyethylene terephthalate, polypropylene, and nylon.

3. The electrically conductive adhesive tape in accordance with claim 1, wherein said metal layer is made of a metal selected from the group consisting of aluminum, copper, silver, brass, nickel, and chromium.

* * * * *